(12) United States Patent
Jaramillo et al.

(10) Patent No.: US 7,771,218 B2
(45) Date of Patent: Aug. 10, 2010

(54) ELECTRICAL COUPLER MATING SYSTEM

(75) Inventors: Joel Jaramillo, Round Rock, TX (US); Laurent A. Regimbal, Round Rock, TX (US); Richard Daniel Trotta, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 153 days.

(21) Appl. No.: 12/115,281

(22) Filed: May 5, 2008

(65) Prior Publication Data

US 2009/0273901 A1 Nov. 5, 2009

(51) Int. Cl.
*H01R 13/62* (2006.01)

(52) U.S. Cl. ...................................... 439/157
(58) Field of Classification Search .............. 439/157, 439/152, 347, 372
See application file for complete search history.

(56) References Cited

U.S. PATENT DOCUMENTS

| | | | |
|---|---|---|---|
| 4,329,005 A | 5/1982 | Bragmetz et al. | |
| 5,178,553 A * | 1/1993 | Hatagishi et al. | 439/157 |
| 5,481,431 A | 1/1996 | Siahpolo et al. | |
| 5,876,226 A * | 3/1999 | Tsukakoshi et al. | 439/157 |
| 5,915,982 A * | 6/1999 | Kashiyama et al. | 439/157 |
| 5,967,808 A * | 10/1999 | Kubota | 439/157 |
| 6,118,668 A | 9/2000 | Scholder et al. | |
| 6,137,684 A | 10/2000 | Ayd et al. | |
| 6,155,850 A * | 12/2000 | Martin et al. | 439/157 |
| 6,979,213 B1 * | 12/2005 | Mauney et al. | 439/157 |
| 7,097,476 B2 * | 8/2006 | Morikawa et al. | 439/157 |
| 2002/0016100 A1 * | 2/2002 | Okabe et al. | 439/157 |
| 2007/0025095 A1 | 2/2007 | Beall et al. | |
| 2007/0066108 A1 * | 3/2007 | Razafiarivelo et al. | 439/180 |

* cited by examiner

*Primary Examiner*—Michael C Zarroli
*Assistant Examiner*—Harshad C Patel
(74) *Attorney, Agent, or Firm*—Haynes and Boone, LLP

(57) ABSTRACT

An electrical coupler mating system includes a chassis having a plurality of walls, wherein a chassis housing is defined between the plurality of walls. At least one of the plurality of walls defines a first guide channel and houses a cam member that is located adjacent the first guide channel. A first electrical coupler is located in the chassis housing. An enclosure includes a second electrical coupler and a cam follower that is moveably coupled to the enclosure, wherein with the cam follower located in the first guide channel, the second electrical coupler is aligned with the first electrical coupler and the movement of the cam follower mates the first electrical coupler and the second electrical coupler.

16 Claims, 17 Drawing Sheets

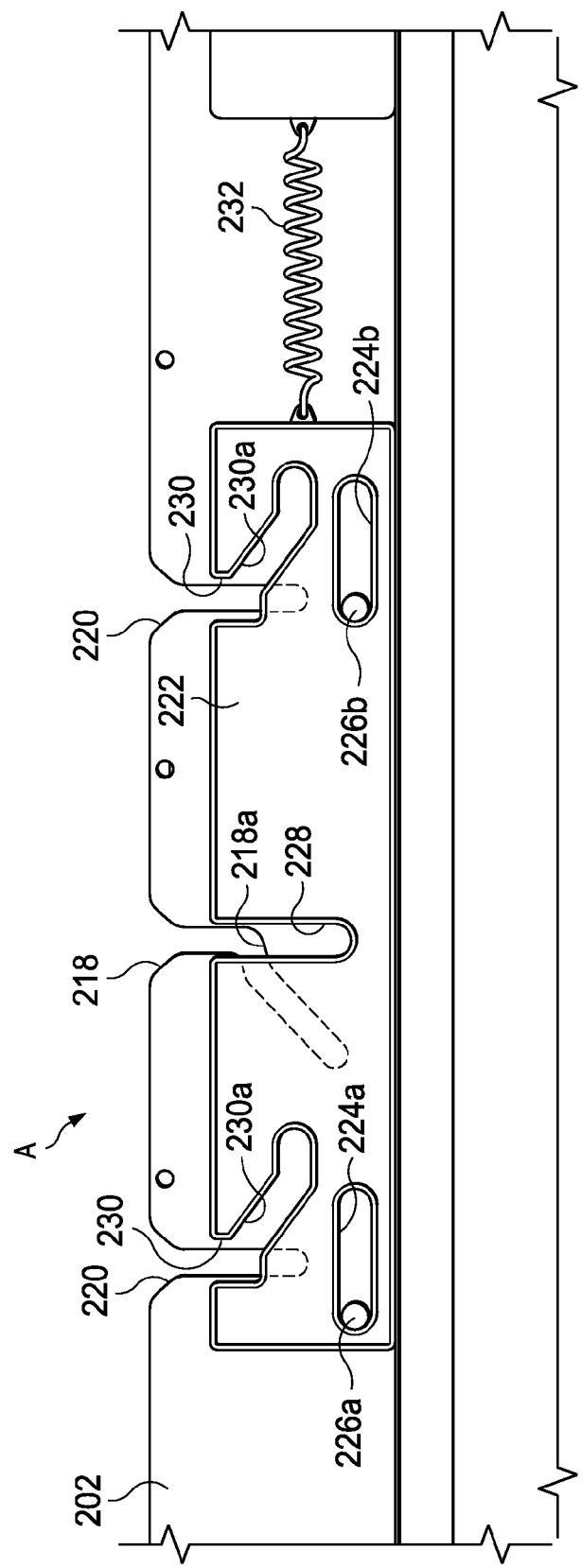

ELECTRICAL COUPLER MATING SYSTEM

BACKGROUND

The present disclosure relates generally to information handling systems, and more particularly to an electrical coupler mating system for use in an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs include electrical couplings that may include, for example, a male plug that is mated to a female plug. In some instances, the force required to mate and un-mate the plugs may be relatively high (e.g. approximately 60 pounds of force relative to conventional IHS plugs that require approximately 20 pounds of force). Generating the proper force in the proper direction can be further complicated by, for example, the placement of the electrical coupling away from structural members in a chassis that has a limited volume available for mechanisms that would assist in providing the relatively high force needed, the provision of multiple electrical couplings which may require simultaneous mating, and/or a variety of other mating complications known in the art. Generating an improper force and/or generating the force in an improper direction can result in damage to the electrical coupling.

Accordingly, it would be desirable to provide an improved electrical coupler mating system absent the disadvantages discussed above.

SUMMARY

According to one embodiment, an electrical coupler mating system includes a chassis including a plurality of walls, wherein a chassis housing is defined between the plurality of walls, at least one of the plurality of walls defining a first guide channel and housing a cam member that is located adjacent the first guide channel, a first electrical coupler located in the chassis housing, and an enclosure comprising a second electrical coupler and a cam follower that is moveably coupled to the enclosure, wherein with the cam follower located in the first guide channel, the second electrical coupler is aligned with the first electrical coupler and the movement of the cam follower mates the first electrical coupler and the second electrical coupler.

BRIEF DESCRIPTION OF THE DRAWINGS

FIG. 2b is a partial cut-away perspective view illustrating an embodiment of the chassis of FIG. 2a.

FIG. 2c is a partial cut-away side view of a cam member in the chassis of FIGS. 2a and 2b.

FIG. 4b is a bottom perspective view illustrating an embodiment of the enclosure of FIG. 4a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
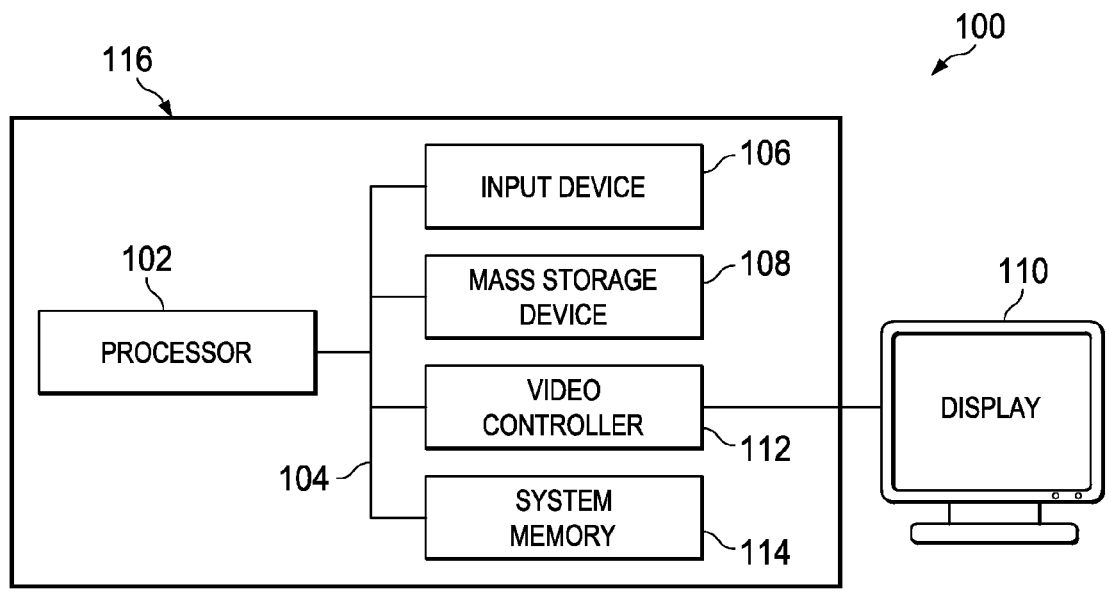
FIG. 1 is a schematic view illustrating an embodiment of an IHS.
Figure 5A:
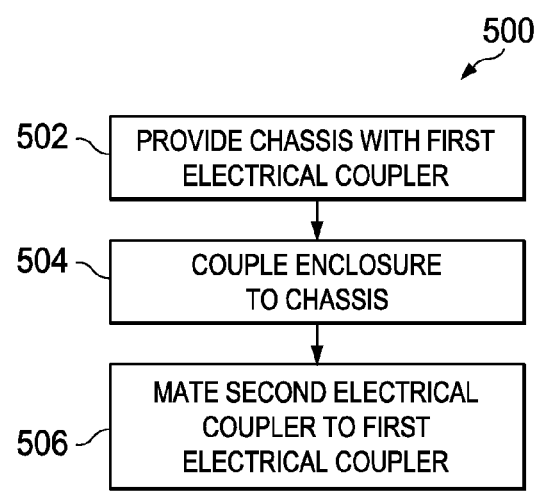
FIG. 5a is a flow chart illustrating an embodiment of a method for mating electrical couplers.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
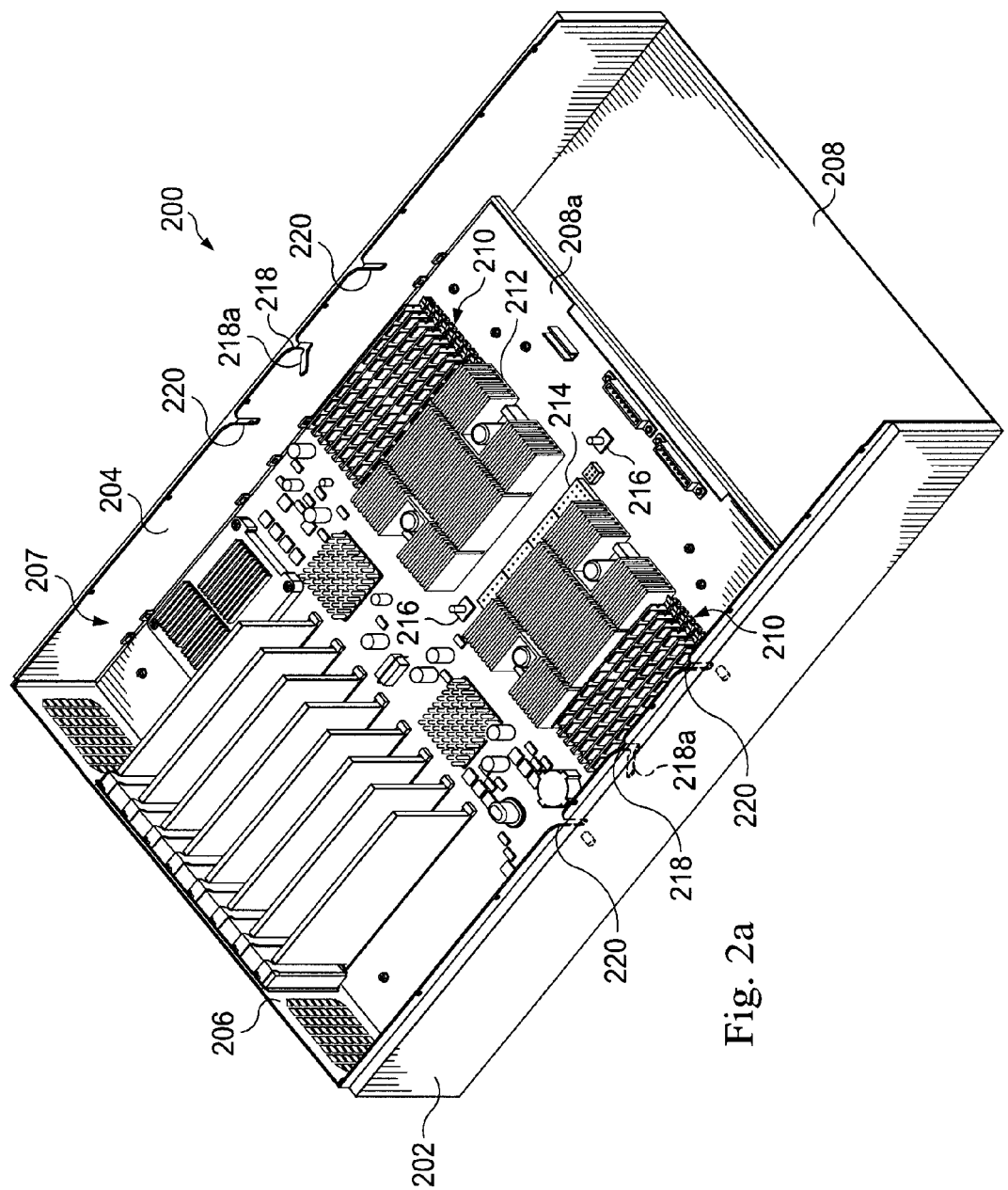
FIG. 2a is a perspective view illustrating an embodiment of a chassis.

Referring now to FIG. 2a, a chassis 200 is illustrated. In an embodiment, the chassis 200 may be, for example, the chassis 116, described above with reference to FIG. 1. The chassis 200 includes a pair of opposing, substantially parallel chassis side walls 202 and 204 and a chassis front wall 206 that extends between the chassis side walls 202 and 204. A chassis floor 208 extends between the chassis side walls 202 and 204 and the chassis front wall 206. A chassis housing 207 is defined by the chassis 200 between the chassis sides walls 202 and 204, the chassis front wall 206, and the chassis floor 208. In an embodiment, the chassis floor 208 includes a board 208a such as, for example, a circuit board known in the art, that is located in the chassis housing 207 and may extend between the chassis side walls 202 and 204 and the chassis front wall 206. In an embodiment, the board may extend between the chassis side walls 202 and 204 such that the chassis floor 208 is not accessible without removal of the board from the chassis volume 207. In an embodiment, a plurality of components are located in the chassis housing 207 on the board 208a on the chassis floor 208 such as, for example, a plurality of memory units 210 located adjacent the side wall 204, a heat sink 212 located adjacent the memory units 210, an electrical coupler 214 located adjacent the heat sink 212, and a pair of electrical coupler guide posts 216 located on either side of the electrical coupler 214. In an embodiment, the electrical coupler 214 is centrally located on the board on the chassis floor 208 and away from the chassis side walls 202 and 204. In an embodiment, the electrical coupler 214 is part of an electrical coupling that includes a high mating force set of multi-pin connectors that require approximately 60 pounds of force for mating and approximately 45 pounds of force for un-mating. One of skill in the art will recognize that a plurality of other components may be included in the chassis housing 207 on the board 208a on the chassis floor 208 without departing from the scope of this disclosure. For example, in FIG. 2a, the chassis side wall 202 may be obscuring an additional heat sink 212 and memory units 210 that are located in the chassis housing 207 and included on the board 208a on the chassis floor 208 opposite the electrical coupler 214 from the heat sink 212 and memory unites 210. In an embodiment, the heat sinks 212 that are shown in FIG. 2a may each be coupled to a processor, which may be the processor 102 described above with respect to FIG. 1, that is mounted to the board 208a on the chassis floor 208 and coupled to the electrical coupler 214.

Figure 2B:
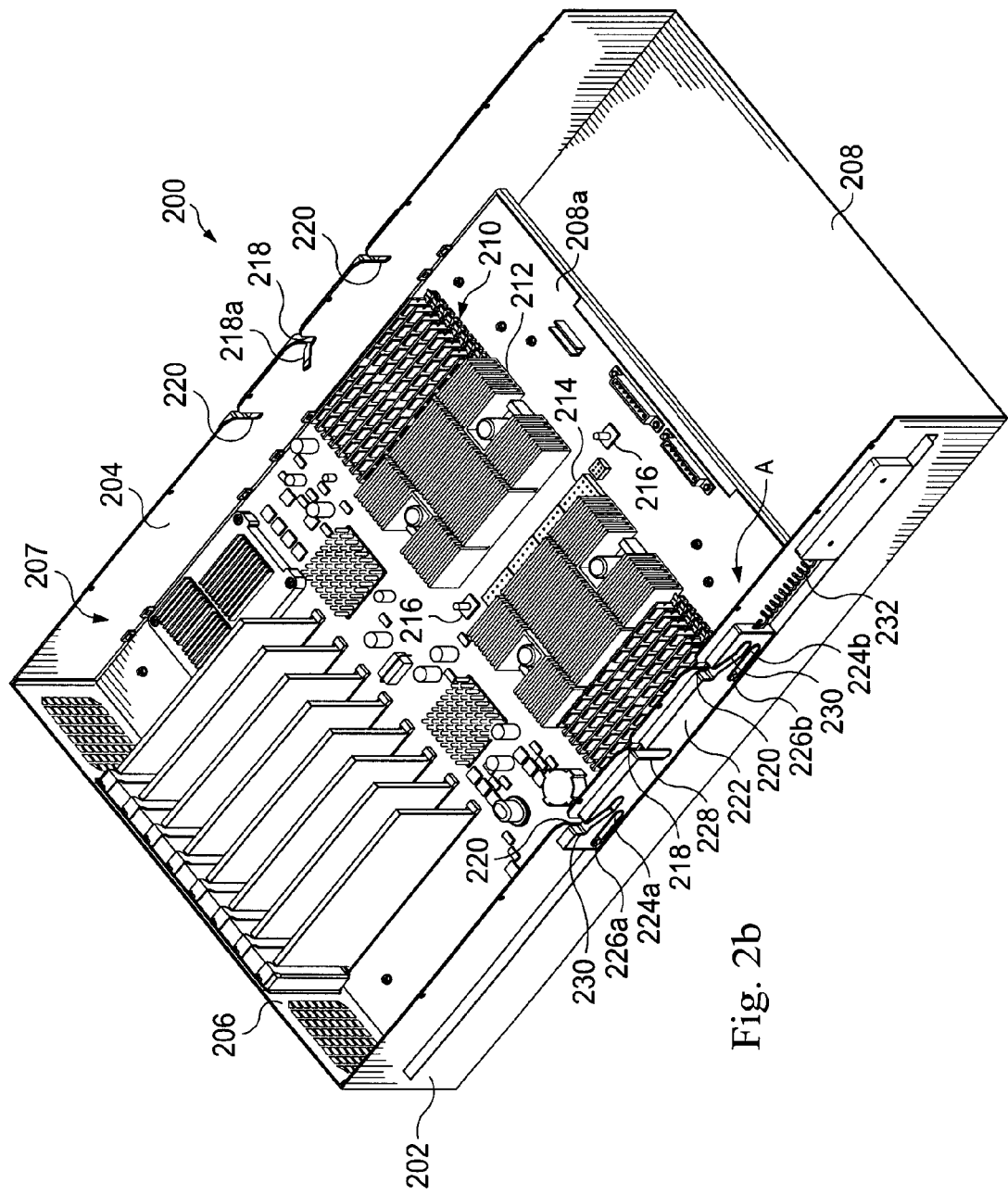

Referring now to FIGS. 2a, 2b and 2c, each chassis side wall 202 and 204 defines a first guide channel 218 that extends into the chassis side wall 202 and 204 from an edge of the chassis side wall 202 and 204. A plurality of second guide channels 220 are defined by each of the chassis side walls 202 and 204, extend into the chassis side walls 202 and 204 from an edge of the chassis side walls 202 and 204, and are located on either side of the first guide channel 218 that is defined by the chassis side wall 202 and 204. As illustrated in FIGS. 2a and 2b, the first guide channel 218 initially extends substantially vertically into the chassis side wall 204 and then includes a bend 218a, while the second guide channels 220 extend substantially vertically into the chassis side wall 204. In an embodiment, the first guide channel 218 and the second guide channels 220 on the chassis side wall 202 are mirror images of the first guide channel 218 and the second guide channels 220 on the chassis side wall 204. As illustrated in the partial cut-away views of FIGS. 2b and 2c that illustrate the chassis side wall 202 with a portion of the chassis side wall 202 removed, the chassis side wall 202 houses a cam member 222. The cam member 222 is slidably coupled to the chassis side wall 202 through the engagement of a plurality of slide channels 224a and 224b defined by the cam member 222 and a plurality of slide pegs 226a and 226b located on the chassis side wall 202. The cam member 222 defines a first cam member channel 228 that extends from an edge of the cam member 222 and substantially vertically into the cam member 222. The cam member 222 also defines a pair of second cam member channels 230 that each initially extend substantially vertically into the cam member 222 and include a bend 230a until the second cam member channel 230 is substantially horizontal. A spring 232 is coupled to the chassis side wall 202 and the cam member 222 and resiliently biases the cam member 222 into a receiving position A, illustrated in FIGS. 2b and 2c, with the entrances of first cam member channel 228 and the first guide channel 218 on the chassis side wall 202 substantially aligned, and the entrances of the second cam member channels 230 and the second guide channels 220 on the chassis side wall 202 substantially aligned. In an embodiment, the chassis side wall 204 includes a cam member that is substantially similar in structure and operation to the cam member 222.

Figure 3:
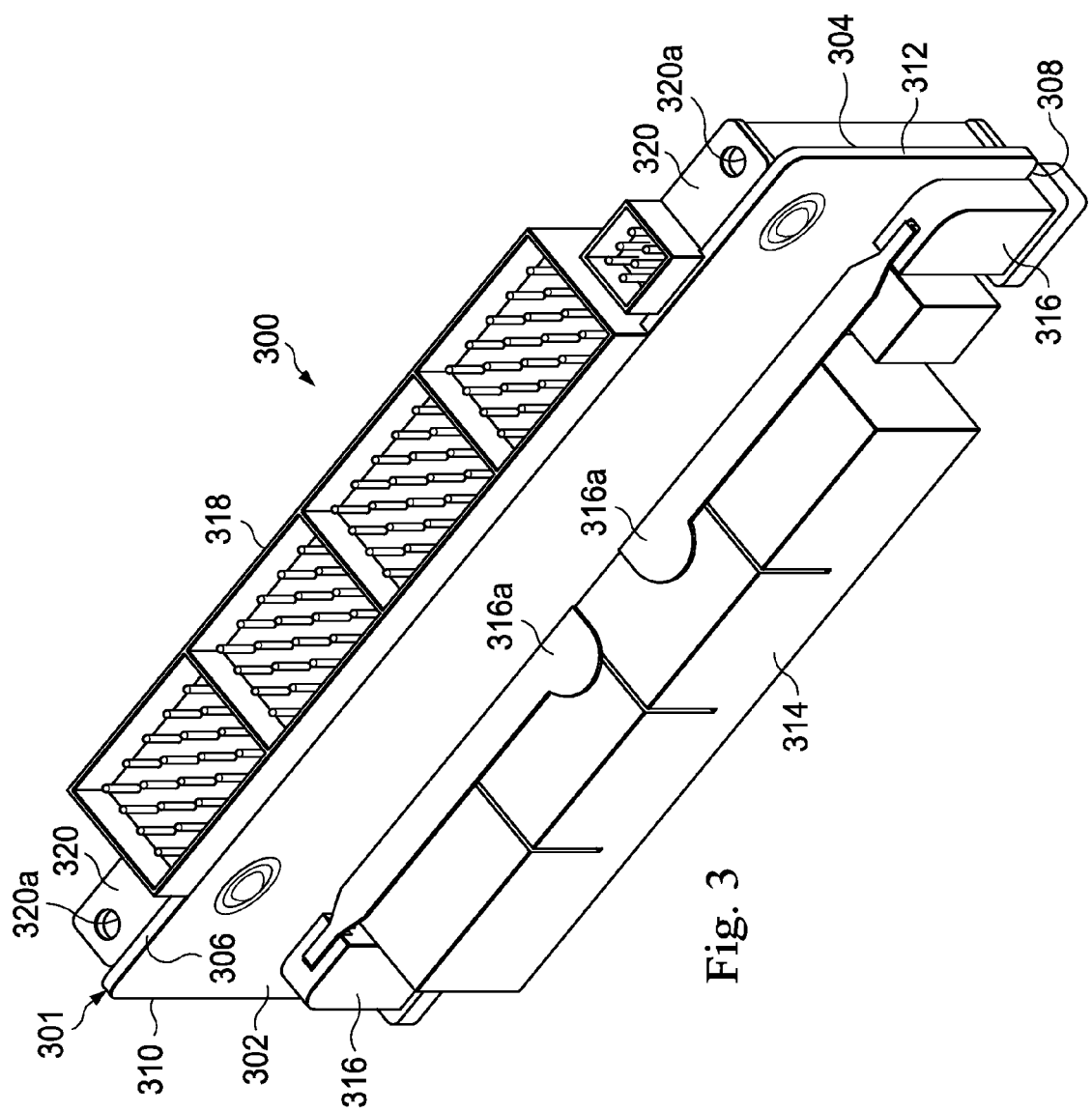
FIG. 3 is a perspective view illustrating an embodiment of a riser used with the chassis of FIGS. 2a, 2b and 2c.

Referring now to FIG. 3, a riser 300 is illustrated. The riser 300 includes a board 301 having a front surface 302, a rear surface 304 located opposite the front surface 302, a top edge 306 extending between the front surface 302 and the rear surface 304, a bottom edge 308 located opposite the top edge 306 and extending between the front surface 302 and the rear surface 304, and a pair of opposing side edges 310 and 312 extending between the front surface 302, the rear surface 304, the top edge 306, and the bottom edge 308. In an embodiment, the board 301 is a circuit board. An electrical coupler 314 is located adjacent the bottom edge 308 of the board 301. In an embodiment, the electrical coupler 314 is part of an electrical coupling that includes a high mating force set of multi-pin connectors that require approximately 60 pounds of force for mating and approximately 45 pounds of force for un-mating. A plurality of securing members 316, each including a securing beam 316a, are located on either side of electrical coupler 314. An electrical coupler 318 is located adjacent the top edge 306 of the board 301. In an embodiment, the electrical coupler 318 is part of an electrical coupling that includes a high mating force set of multi-pin connectors that require approximately 60 pounds of force for mating and approximately 45 pounds of force for disconnecting. A plurality of securing members 320, each defining a guide aperture 320a, are located on either side of electrical coupler 318. In an embodiment, the electrical coupler 314 and securing members 316 are substantially similar to the electrical coupler 318 and securing members 320, respectively, such that each of the securing members 316 may include a guide aperture similar to the guide apertures 320a and/or each of the securing members 320 may include a securing beam similar to the securing beam 316a.

Figure 4A:
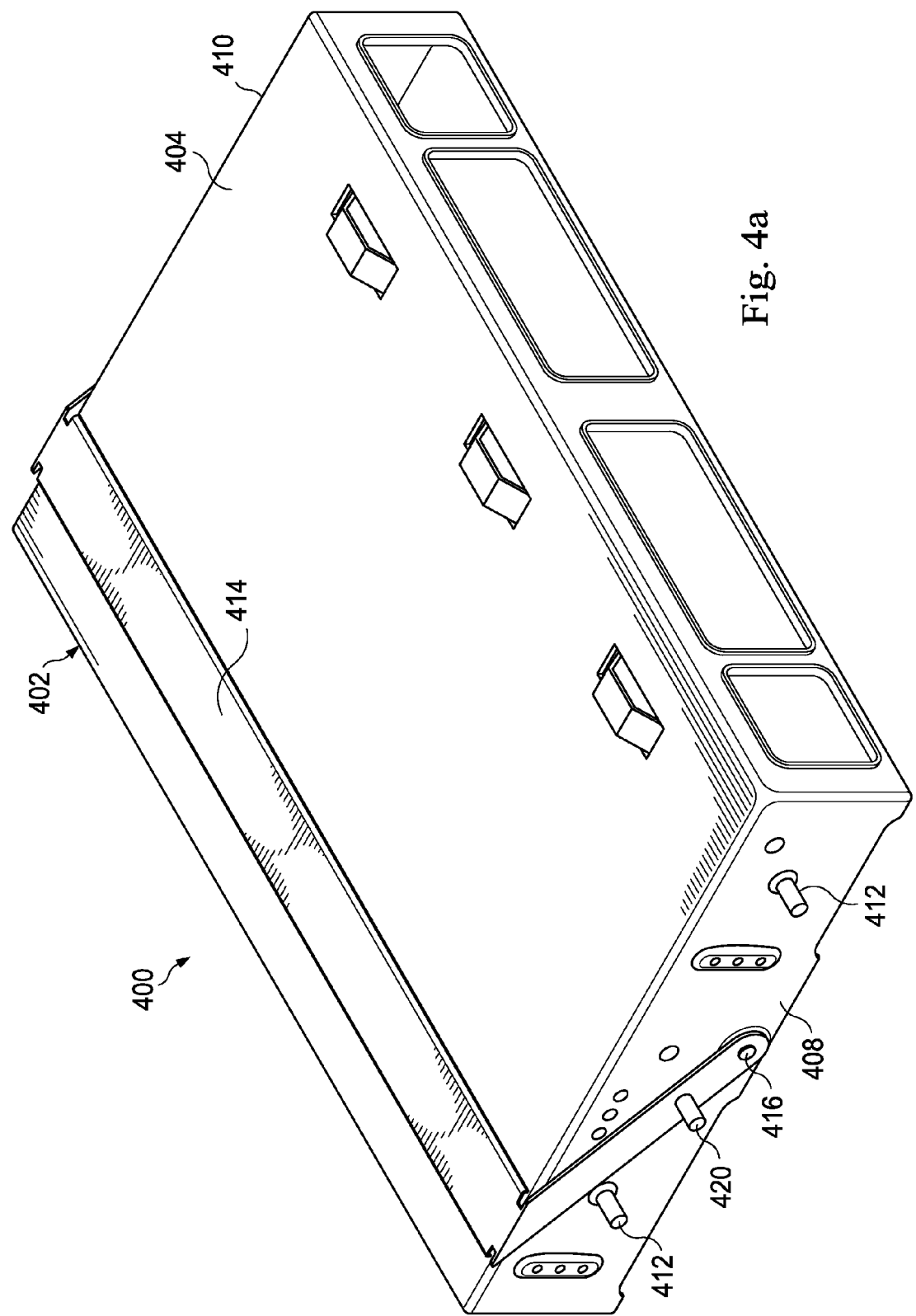
FIG. 4a is a top perspective view illustrating an embodiment of an enclosure used with the riser of FIG. 3 and the chassis of FIGS. 2a, 2b and 2c.
Figure 4B:
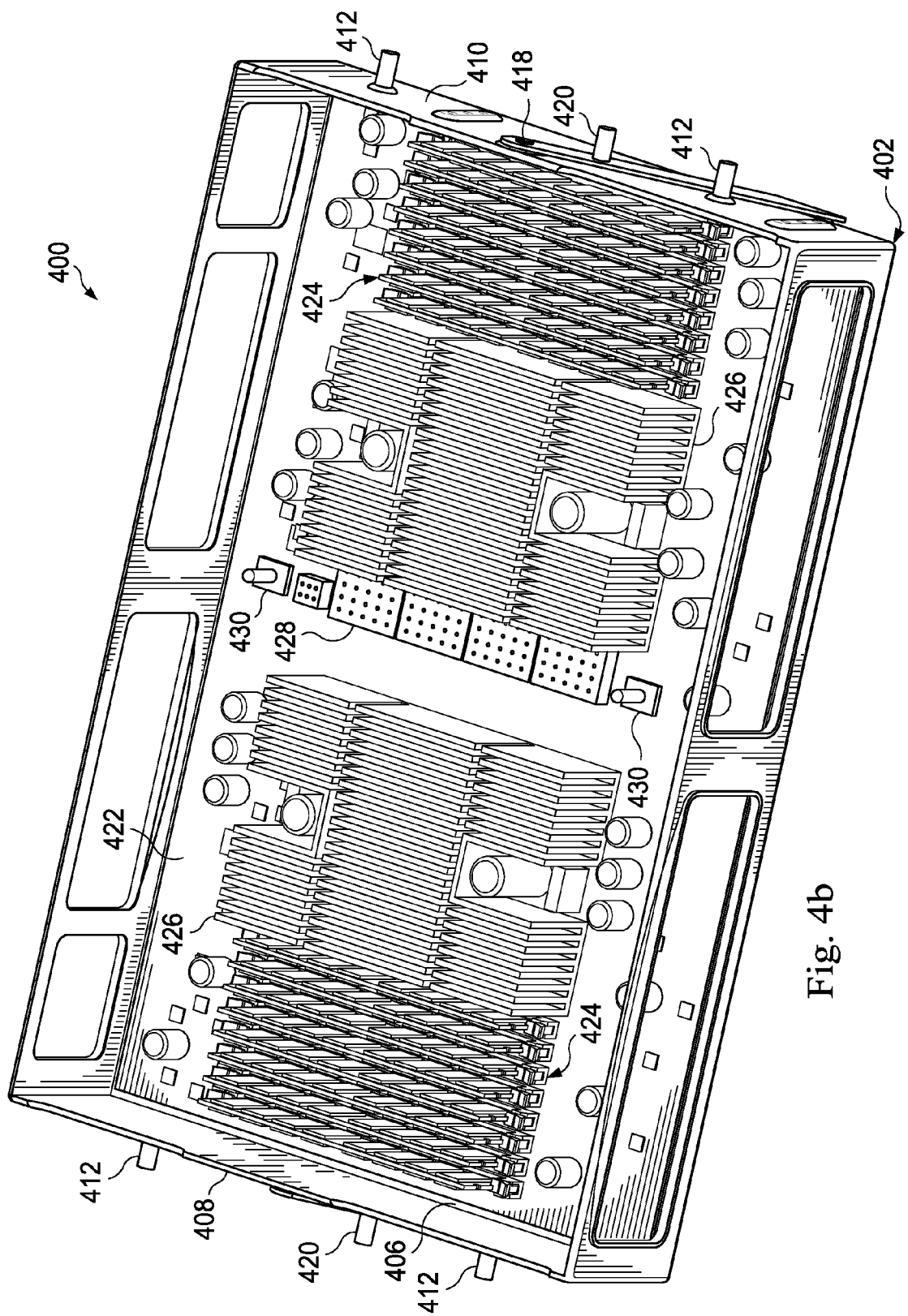

Referring now to FIGS. 4a and 4b, an enclosure 400 is illustrated. The enclosure 400 includes a base wall 402 having a top surface 404 and a bottom surface 406 located opposite the top surface 404. A pair of opposing enclosure side walls 408 and 410 extend from opposite edges of the base wall 402 in a substantially parallel orientation to each other. Each of the enclosure side walls 408 and 410 include a plurality of guide members 412 that extend from the side walls 408 and 410 on opposite sides of the side walls 408 and 410. A handle member 414 is rotatably coupled to the enclosure 400 through a pair of rotation couplings 416 and 418 on the enclosure side walls 408 and 410, respectively. A plurality of cam followers 420 extend from the handle 414, with one of the cam followers located adjacent the enclosure side wall 408 and between the guide members 412 extending from the enclosure side wall 408, and one of the cam followers located adjacent the enclosure side wall 410 and between the guide members 412 extending from the enclosure side wall 410. A board 422 is located adjacent the bottom surface 406 of the base wall 402 and includes a plurality of components such as, for example, a plurality of memory units 424 located adjacent the enclosure side walls 408 and 410, a plurality of heat sinks 426 located between the memory units 424, an electrical coupler 428 located between the heat sinks 426, and a pair of electrical coupler guide posts 430 located on either side of the electrical coupler 428. In an embodiment, the electrical coupler 428 is part of an electrical coupling that includes a high mating force set of multi-pin connectors that require approximately 60 pounds of force for mating and approximately 45 pounds of force for un-mating. One of skill in the art will recognize that a plurality of other components may be included on the board 422 without departing from the scope of this disclosure. In an embodiment, the heat sinks 426 may each be coupled to a processor, which may be the processor 102 that is described above with respect to FIG. 1, that is mounted to the board 422 and coupled to the electrical coupler 428.

Figure 5B:
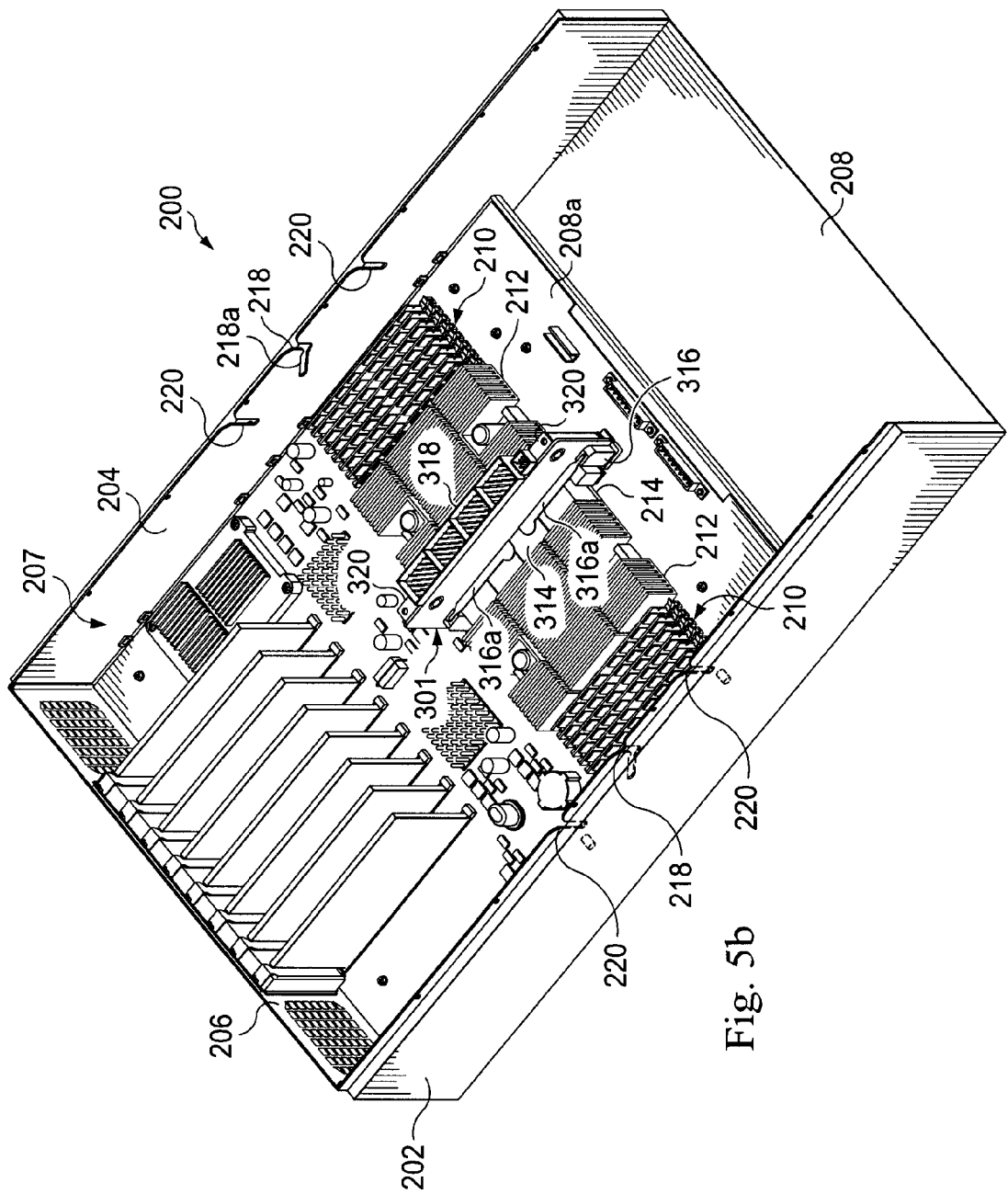
FIG. 5b is a perspective view illustrating an embodiment of the riser of FIG. 3 coupled to the chassis of FIGS. 2a, 2b and 2c.

Referring now to FIGS. 2a, 2b, 3, 5a and 5b, a method 500 for mating electrical couplers is illustrated. The method 500 begins at block 502 where a chassis with a first electrical coupler is provided. In an embodiment, the chassis 200 including the electrical coupler 214 is provided. In an embodiment, the riser 300 may be coupled to the electrical coupler 214 by positioning the riser 300 in the chassis volume 207 such that the electrical coupler 314 on the riser 300 is located adjacent the electrical coupler 214 on the chassis 200 and apertures (not shown) on the securing members 316 are aligned with the electrical coupler guide posts 216. The riser 300 is then brought towards the electrical coupler 214 such that the electrical coupler guide posts 216 enter the apertures (not shown) on the securing members 316 and the electrical coupler 314 on the riser 300 is mated with the electrical coupler 214 on the chassis 200, as illustrated in FIG. 5b. In an embodiment, the securing beams 316a may then be used to mate and secure the electrical couplers 214 and 314. With the electrical couplers 214 and 314 mated, an electrical coupling is provided between the electrical coupler 318 on the riser 300 and the components that are electrically coupled to the electrical coupler 214 on the chassis 200.

Figure 5C:
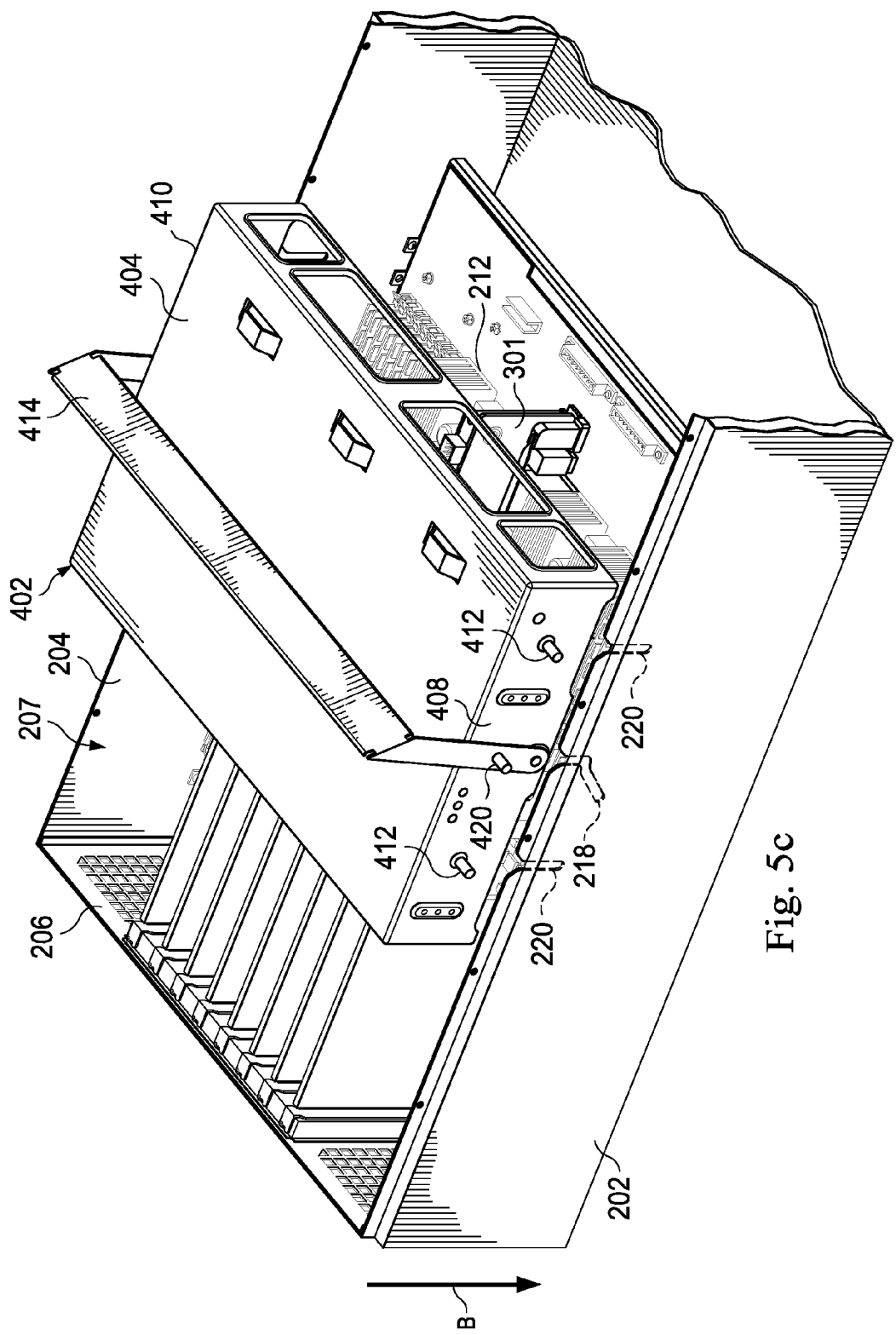
FIG. 5c is a perspective view illustrating an embodiment of the enclosure of FIGS. 4a and 4b being coupled to the riser of FIG. 3 and the chassis of FIGS. 2a, 2b and 2c.
Figure 5D:
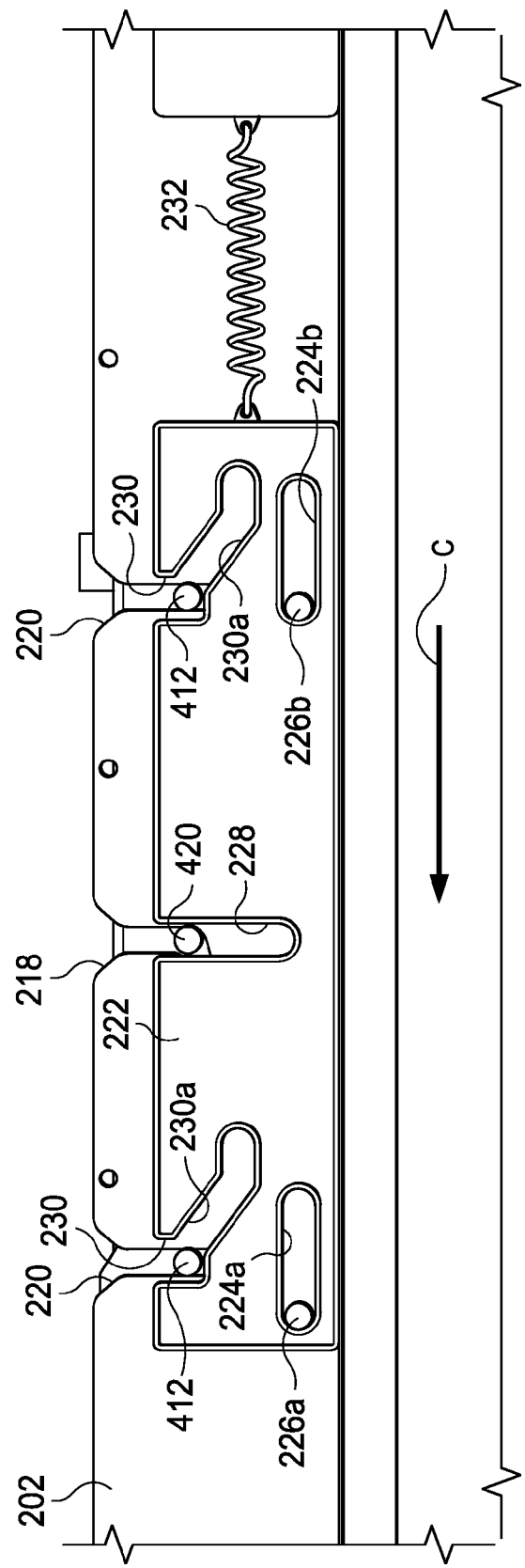
FIG. 5d is a partial cut-away side view illustrating an embodiment of the enclosure of FIGS. 4a and 4b being coupled to the chassis of FIGS. 2a, 2b and 2c.
Figure 5E:
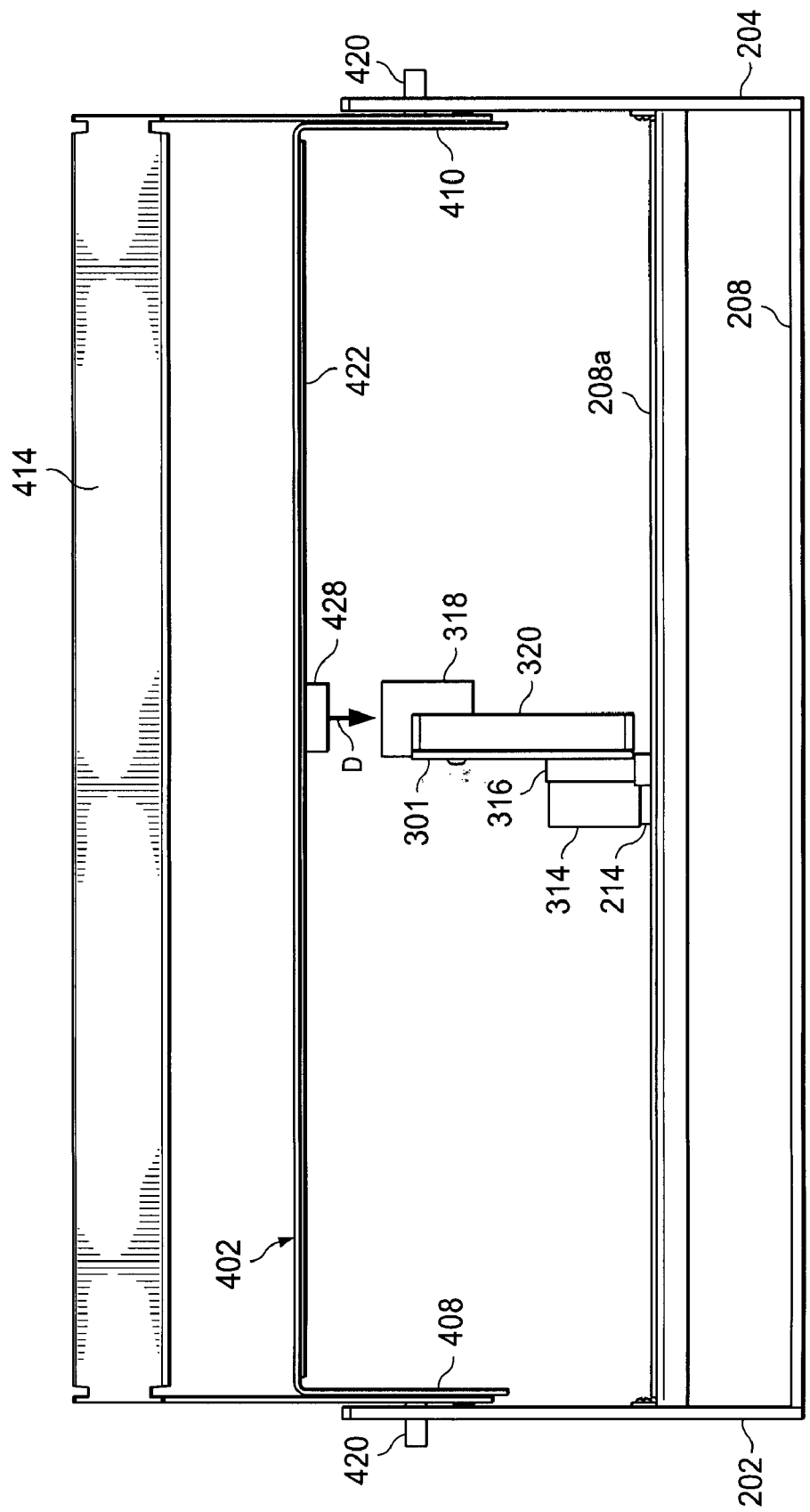
FIG. 5e is a cross sectional view illustrating an embodiment of the enclosure of FIGS. 4a and 4b being coupled to the riser of FIG. 3 and the chassis of FIGS. 2a, 2b and 2c.

Referring now to FIGS. 2a, 2b, 2c, 3, 4a, 4b, 5a, 5b, 5c, 5d and 5e, the method 500 then proceeds to block 504 where an enclosure is coupled to the chassis. In an embodiment, the enclosure 400 is positioned adjacent the chassis 200 such that the enclosure side wall 408 is located adjacent the chassis side wall 202, the enclosure side wall 410 is located adjacent the chassis side wall 204, and the second guide members 412 on the enclosure side walls 408 and 410 are located adjacent the second guide channels 220 defined by the chassis side walls 202 and 204, respectively. The handle member 414 is rotated relative to the top surface 404 on the enclosure 400 until it is approximately perpendicular to the enclosure 400 such that the cam followers 420 adjacent the enclosure side walls 408 and 410 are located adjacent the first guide channels 218 defined by the chassis side walls 202 and 204, respectively, as illustrated in FIG. 5c. The enclosure 400 is then moved in a direction B such that the second guide members 412 on the enclosure side walls 408 and 410 enter the second guide channels 220 defined by the chassis side walls 202 and 204, respectively, and second cam member channels 230 on the cam members (e.g. the cam member 222) housed in the chassis side walls 202 and 204, respectively, and the cam followers 420 adjacent the enclosure side walls 408 and 410 enter the first guide channels 218 defined by the chassis side walls 202 and 204, respectively, and the first cam member channels 228 on the cam members (e.g. the cam member 222) housed in the chassis side walls 202 and 204, respectively, coupling the enclosure 400 to the chassis 200, as illustrated in FIG. 5d. With the enclosure 400 coupled to the chassis 200, the electrical coupler 428 on the enclosure 400 is aligned with the electrical coupler 318 on the riser 300, as illustrated in FIG. 5e. One of skill in the art will recognize that the handle member 414, cam followers 420, and cam member 222 configuration and location minimize the space that the mating system occupies in the chassis volume 207 and, when the enclosure 400 is removed from the chassis 200, allows maximum access to the chassis volume 207.

Figure 5F:
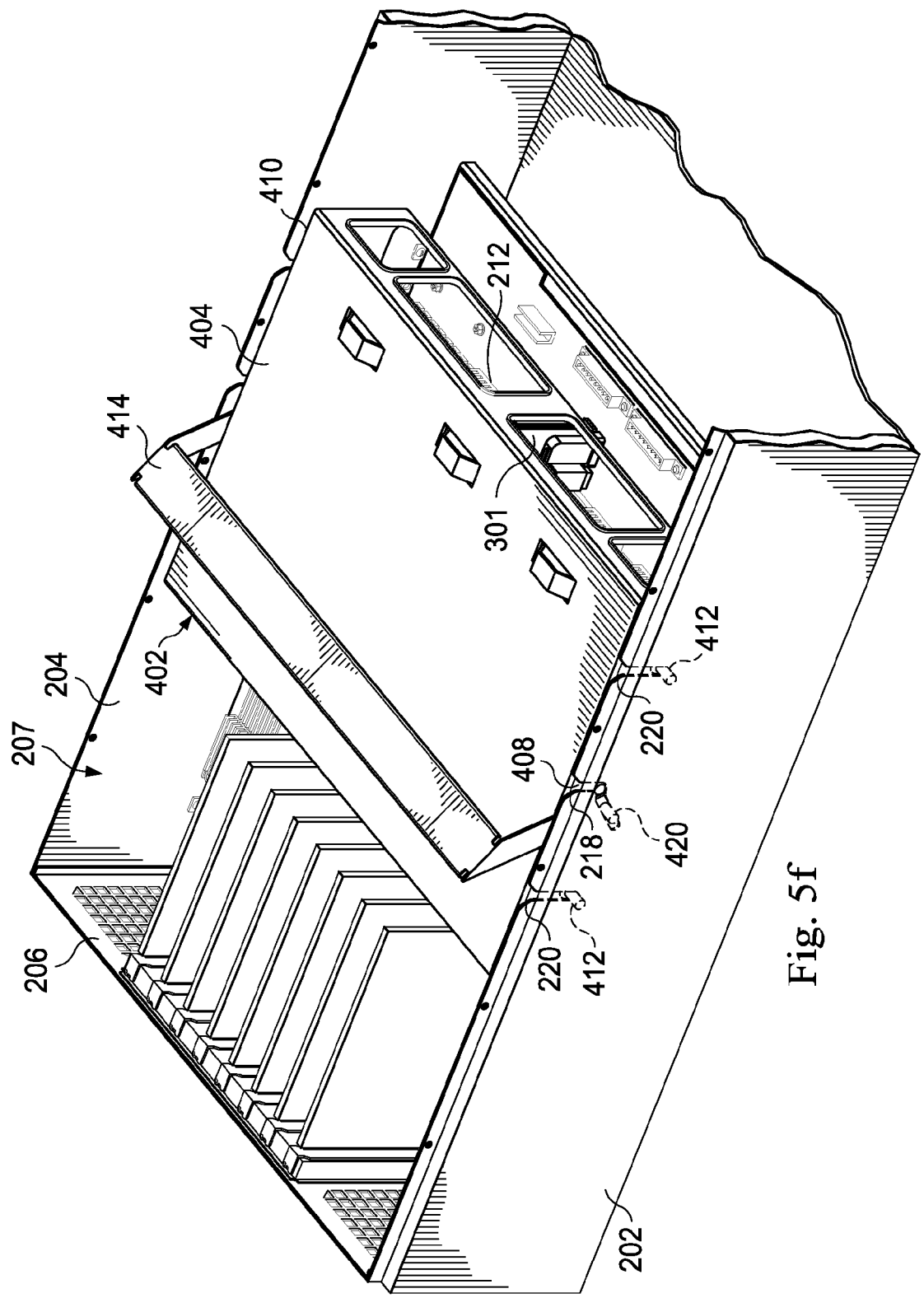
FIG. 5f is a perspective view illustrating an embodiment of the enclosure of FIGS. 4a and 4b being coupled to the riser of FIG. 3 and the chassis of FIGS. 2a, 2b and 2c.
Figure 5G:
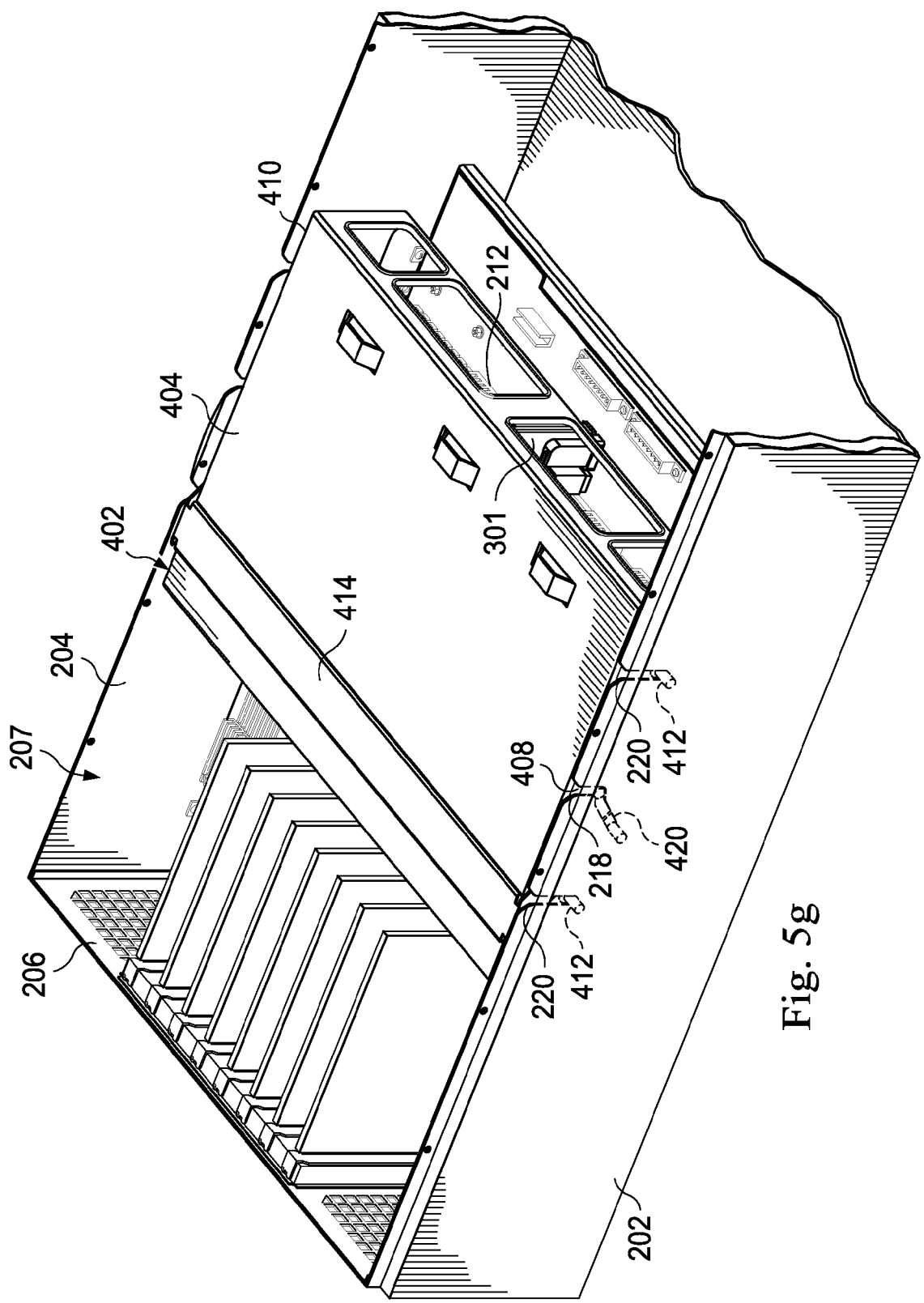
FIG. 5g is a perspective view illustrating an embodiment of the enclosure of FIGS. 4a and 4b coupled to the riser of FIG. 3 and the chassis of FIGS. 2a, 2b and 2c.
Figure 5H:
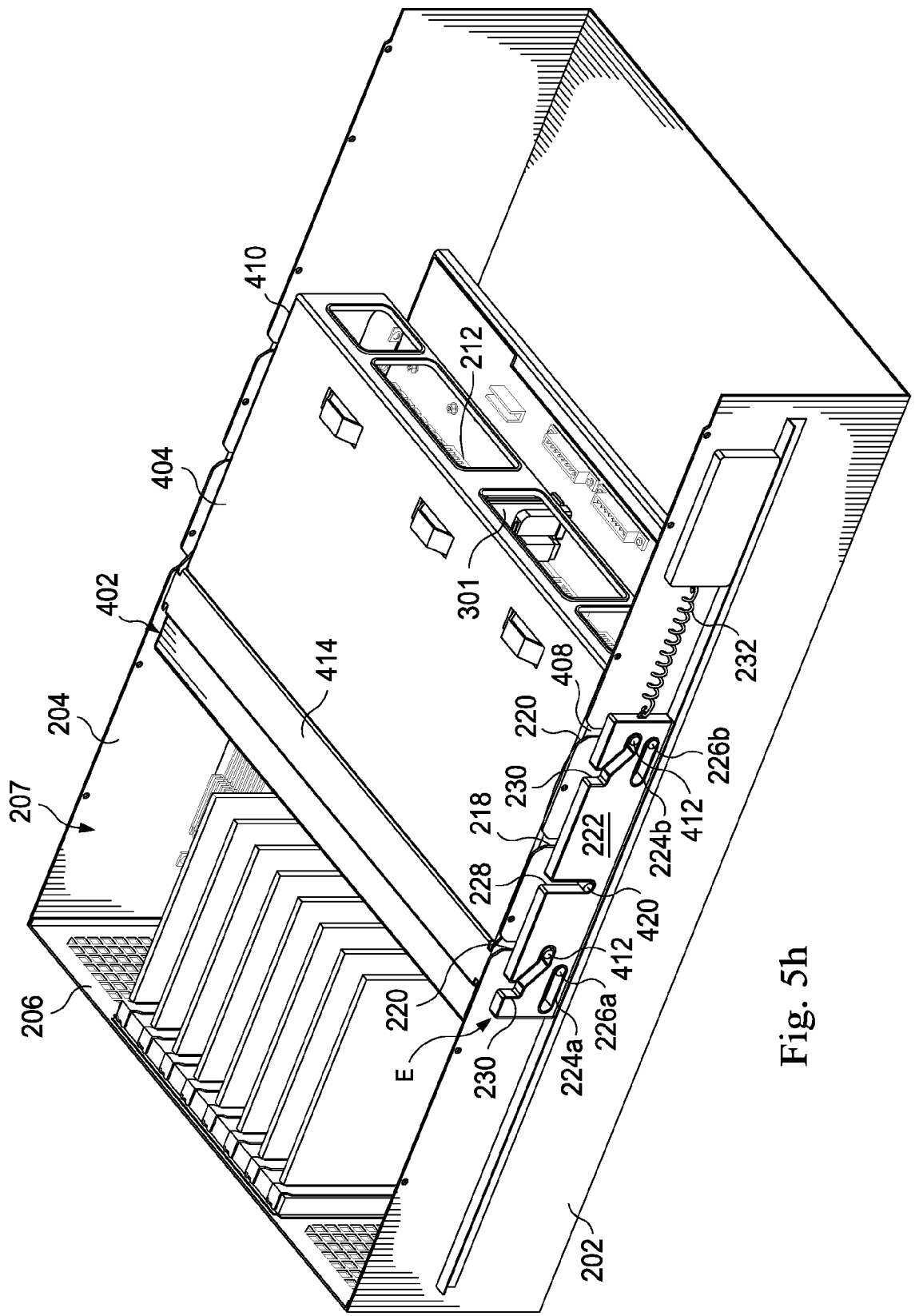
FIG. 5h is a partial cut-away perspective view illustrating an embodiment of the enclosure of FIGS. 4a and 4b coupled to the riser of FIG. 3 and the chassis of FIGS. 2a, 2b and 2c.
Figure 5I:
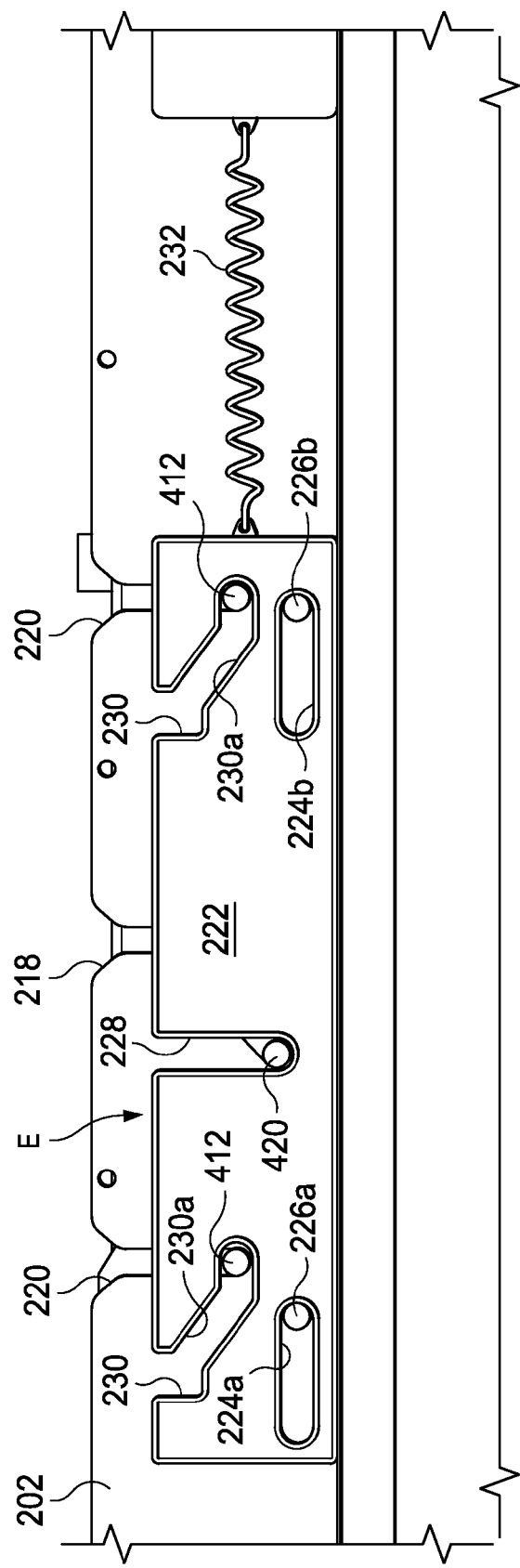
FIG. 5i is a partial cut-away side view illustrating an embodiment of the enclosure of FIGS. 4a and 4b coupled to the chassis of FIGS. 2a, 2b and 2c.
Figure 5J:
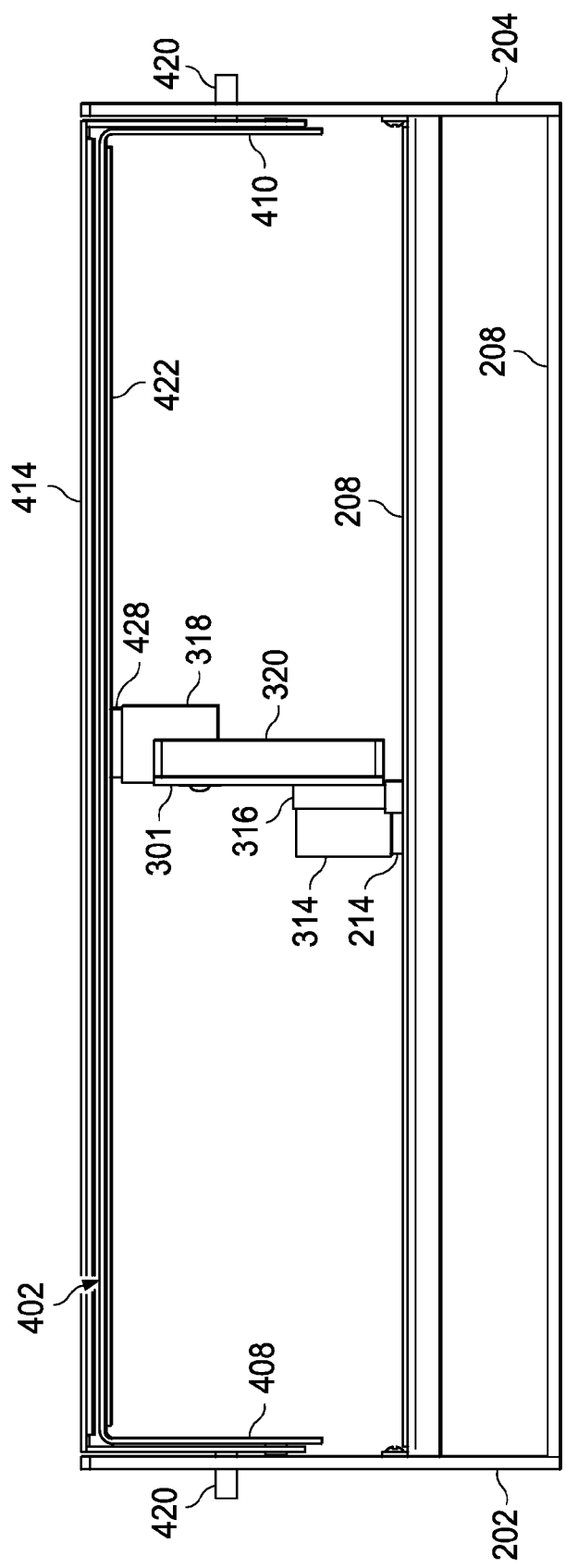
FIG. 5j is a cross sectional view illustrating an embodiment of the enclosure of FIGS. 4a and 4b coupled to the riser of FIG. 3 and the chassis of FIGS. 2a, 2b and 2c.
Figure 5K:
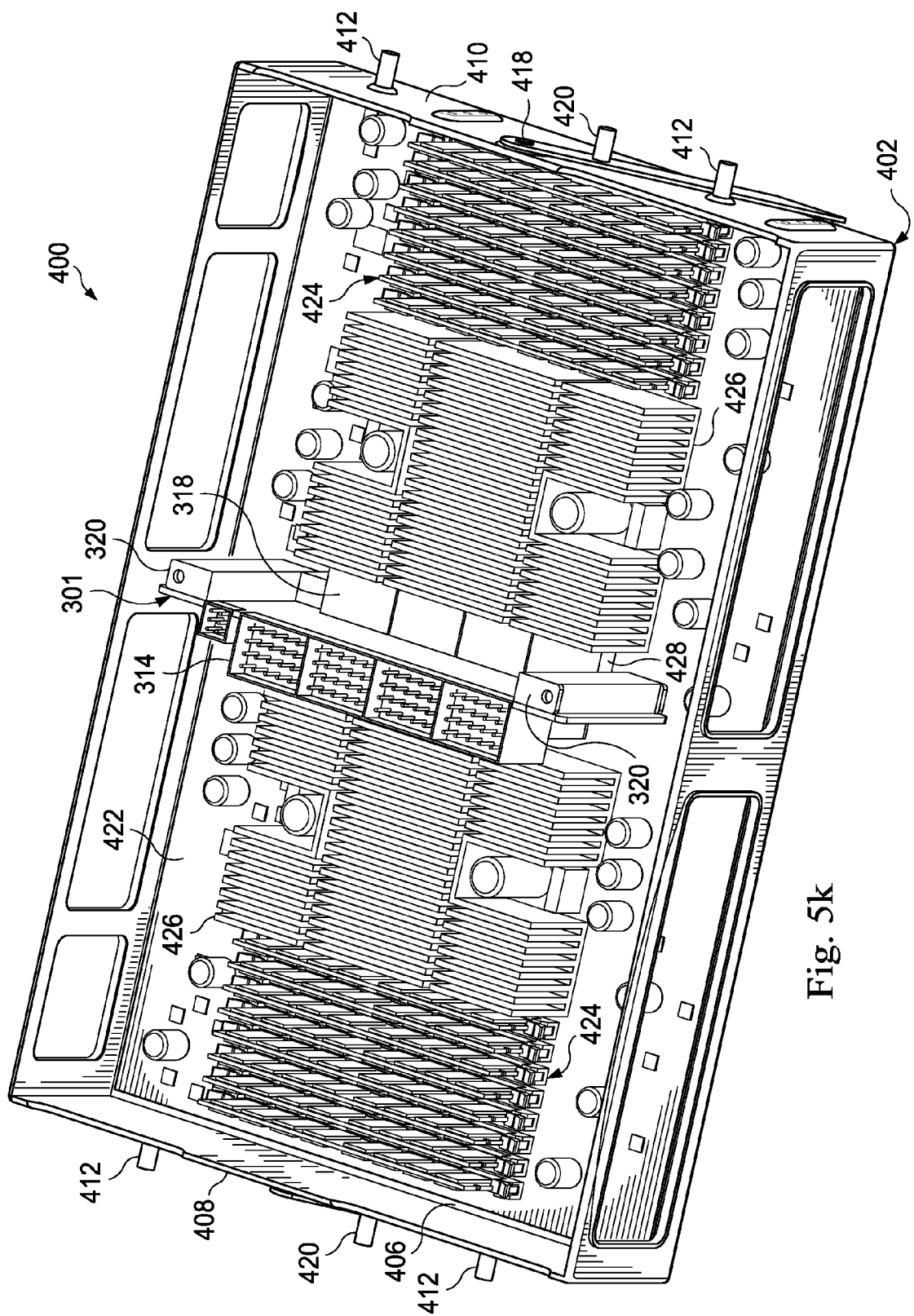
FIG. 5k is a partial perspective view illustrating an embodiment of the enclosure of FIGS. 4a and 4b coupled to the riser of FIG. 3.

Referring now to FIGS. 2a, 2b, 2c, 3, 4a, 4b, 5a, 5b, 5c, 5d, 5e, 5f, 5g, 5h, 5i, 5j and 5k, the method 500 then proceeds to block 506 where a second electrical coupler is mated with a first electrical coupler. The handle member 414 is rotated about the rotational couplings 416 and 418, illustrated in FIG. 5f, such that the cam followers 420 travel through the bends 218a on the first guide channels 218 that are defined by the side walls 202 and 204 while also traveling through the first cam member channel 228. As the cam followers 420 travel through both the bends 218a in the first guide channels 218 defined by the side walls 202 and 204 and the first cam member channel 228, the guide members 412 enter the bend 230a on the second cam member channels 230 and move the cam members (e.g. the cam member 222) housed in the chassis side walls 202 and 204 in a direction C until the handle member 414 engages the top surface 404 of the enclosure 400, as illustrated in FIGS. 5g and 5h. As the handle member 414 moves into engagement with the top surface 404 of the enclosure 400, the electrical coupler 428 on the enclosure 400 is moved in a direction D, illustrated in FIG. 5e, such that the electrical coupler guide posts 430 enter the guide apertures 320a on the securing members 320 until the electrical coupler 428 on the enclosure 400 engages and mates with the electrical coupler 318 on the riser 300, as illustrated in FIG. 5j. With the handle member 414 in engagement with the top surface 404 of the enclosure 400, the cam members (e.g. the cam member 222) housed in the chassis side walls 202 and 204 are located in a securing position E, illustrated in FIGS. 5h and 5i, securing the enclosure 400 in the chassis 200 and ensuring the electrical coupling between the electrical coupler 428 on the enclosure 400 and the electrical coupler 318 on the riser 300, as illustrated in FIGS. 5j and 5k (FIG. 5k illustrating a partial view of the riser 300 and the enclosure 400 with the chassis 200 omitted for clarity). During the mating of the electrical coupler 428 on the enclosure 400 and the electrical coupler 318 on the riser 300, the features described above on the enclosure 400 and the chassis 200 retain the alignment of the electrical couplers 428 and 318 as they are moved toward each other, provide a sufficient mating force to mate the electrical couplers 428 and 318, and provide a mating force vector that is in the direction D and, in an embodiment, substantially normal to both of the electrical couplers 428 and 318. Disconnecting the electrical couplers 428 and 318 may be accomplished by reversing the procedure described in block 506 above by, for example, rotating the handle member 414 such that the handle member 414 is substantially perpendicular to the top surface 404 of the enclosure 400. The enclosure 400 may then be de-coupled form the chassis 200 by moving the enclosure 400 in a direction opposite the direction B, illustrated in FIG. 5c. While an embodiment has been illustrated and described that involves an electrical coupler on the enclosure coupling with an electrical coupler on a riser, one of skill in the art will recognize that the disclosure is not so limited. For example, the riser 300 may be coupled to the enclosure 400, similar to the illustration of FIG. 5k, and the electrical coupler 318 on the riser 300 in the enclosure/riser combination may then be coupled to the electrical coupler 214 in the chassis 200. In another example, the riser 300 may be omitted, and an electrical coupler on the enclosure 400 may be coupled to an electrical coupler in the chassis 200. Thus, a electrical coupler mating system is provided that allows a relatively high force to be generated in a specific direction for the mating of electrical couplers in a chassis, while generating that force by engaging structural members located outside of a chassis housing defined by that chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An electrical coupler mating system, comprising:
a chassis comprising a plurality of walls, wherein a chassis housing is defined between the plurality of walls;
at least one of the plurality of walls defining a first guide channel, housing a cam member that is located adjacent the first guide channel, and defining a plurality of second guide channels located adjacent the cam member;
a first electrical coupler located in the chassis housing;
an enclosure comprising a second electrical coupler and a cam follower that is moveably coupled to the enclosure, wherein with the cam follower located in the first guide channel, the second electrical coupler is aligned with the first electrical coupler and the movement of the cam follower mates the first electrical coupler and the second electrical; and
a plurality of guide members located on the enclosure, wherein the plurality of guide members are each operable to be positioned in one of the plurality of second guide channels and in engagement with the cam member.

2. The electrical coupler mating system of claim 1, wherein the plurality of walls comprise a plurality of spaced apart, parallel walls, each wall comprising a first guide channel and housing said cam member that is located adjacent the first guide channel.

3. The electrical coupler mating system of claim 1, wherein the cam follower is coupled to a handle member that is rotatably coupled to the enclosure.

4. The electrical coupler mating system of claim 1, wherein movement of the cam follower to mate the first electrical coupler and the second electrical coupler moves the second electrical coupler towards the first electrical coupler while retaining the alignment of the second electrical coupler and the first electrical coupler, and provides a mating force vector that is normal to both the first electrical coupler and the second electrical coupler.

5. The electrical coupler mating system of claim 1, further comprising:
a riser electrically coupled to a board located in the chassis housing, wherein the first electrical coupler is located on the riser.

6. The electrical coupler mating system of claim 1, wherein the cam member is resiliently biased in a receiving position.

7. An information handling system (IHS), comprising:
a chassis comprising a plurality of walls, wherein a chassis housing is defined between the plurality of walls;
at least one of the plurality of walls defining a first guide channel and housing a cam member that is located adjacent the first guide channel;
a first processor located in the chassis housing;
a first electrical coupler coupled to the first processor and located in the chassis housing; and
an enclosure comprising a second electrical coupler and a cam follower that is moveably coupled to the enclosure, wherein with the cam follower located in the first guide channel, the second electrical coupler is aligned with the first electrical coupler and the movement of the cam follower mates the first electrical coupler and the second electrical coupler such that the second electrical coupler is coupled to the first processor.

8. The IHS of claim 7, further comprising:
a board extending between the plurality of walls, wherein the first processor and the first electrical coupler are located on the board.

9. The IHS of claim 7, further comprising:
a board coupled to the enclosure, wherein the second electrical coupler is located on the board; and
a second processor located on the board and coupled to the second electrical coupler, wherein the mating of the second electrical coupler and the first electrical coupler couples the second processor to the first processor.

10. The IHS of claim 7, wherein the plurality of walls comprise a plurality of spaced apart, parallel walls, each wall comprising a first guide channel and housing a cam member that is located adjacent the first guide channel.

11. The IHS of claim 7, wherein the cam follower is coupled to a handle member that is rotatably coupled to the enclosure.

12. The IHS of claim 7, wherein the at least one of the plurality of walls defines a plurality of second guide channels located adjacent the cam member.

13. The IHS of claim 12, further comprising:
a plurality of guide members located on the enclosure, wherein the plurality of guide members are each operable to be positioned in one of the plurality of second guide channels and in engagement with the cam member.

14. The IHS of claim 7, wherein movement of the cam follower to mate the first electrical coupler and the second electrical coupler moves the second electrical coupler towards the first electrical coupler while retaining the alignment of the second electrical coupler and the first electrical coupler, and provides a mating force vector that is normal to both the first electrical coupler and the second electrical coupler.

15. The IHS of claim 7, further comprising:
a riser electrically coupled to a board located in the chassis housing, wherein the first electrical coupler is located on the riser.

16. The IHS of claim 7, wherein the cam member is resiliently biased in a receiving position.

* * * * *

UNITED STATES PATENT AND TRADEMARK OFFICE
CERTIFICATE OF CORRECTION

| | | |
|---|---|---|
| PATENT NO. | : 7,771,218 B2 | Page 1 of 1 |
| APPLICATION NO. | : 12/115281 | |
| DATED | : August 10, 2010 | |
| INVENTOR(S) | : Joel Jaramillo et al. | |

It is certified that error appears in the above-identified patent and that said Letters Patent is hereby corrected as shown below:

Column 7, line 57: after electrical and before ; and, insert --coupler--

Signed and Sealed this
Thirtieth Day of August, 2011

David J. Kappos
*Director of the United States Patent and Trademark Office*